United States Patent
Saitoh et al.

(10) Patent No.: US 9,230,997 B2
(45) Date of Patent: Jan. 5, 2016

(54) DISPLAY PANEL

(71) Applicant: Sharp Kabushiki Kaisha, Osaka-shi, Osaka (JP)

(72) Inventors: Takao Saitoh, Osaka (JP); Junya Tane, Osaka (JP); Yuki Komine, Osaka (JP); Kazuya Numata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/383,941

(22) PCT Filed: Mar. 6, 2013

(86) PCT No.: PCT/JP2013/056133
§ 371 (c)(1),
(2) Date: Sep. 9, 2014

(87) PCT Pub. No.: WO2013/137081
PCT Pub. Date: Sep. 19, 2013

(65) Prior Publication Data
US 2015/0034946 A1      Feb. 5, 2015

(30) Foreign Application Priority Data

Mar. 12, 2012   (JP) .................................. 2012-054837

(51) Int. Cl.
*H01L 27/12* (2006.01)
*G02F 1/1345* (2006.01)
*H01L 23/532* (2006.01)

(52) U.S. Cl.
CPC ............ *H01L 27/124* (2013.01); *G02F 1/1345* (2013.01); *G02F 1/13458* (2013.01); *H01L 23/5329* (2013.01); *H01L 27/1225* (2013.01); *H01L 2924/0002* (2013.01)

(58) Field of Classification Search
CPC .............. H01L 27/124; H01L 27/1225; H01L 23/5329
See application file for complete search history.

(56) References Cited

U.S. PATENT DOCUMENTS

| 2008/0062360 | A1* | 3/2008 | Kobayashi et al. ............ 349/106 |
| 2011/0111543 | A1  | 5/2011 | Ono |
| 2012/0112182 | A1* | 5/2012 | Ishii et al. ........................ 257/43 |

FOREIGN PATENT DOCUMENTS

| JP | 2002-303889 A | 10/2002 |
| JP | 2009-128761 A | 6/2009 |
| JP | 2011-100041 A | 5/2011 |

OTHER PUBLICATIONS

Official Communication issued in International Patent Application No. PCT/JP2013/056133, mailed on Apr. 9, 2013.

*Primary Examiner* — Roy Potter
*Assistant Examiner* — Paul Patton
(74) *Attorney, Agent, or Firm* — Keating & Bennett, LLP

(57) ABSTRACT

The present invention provides a display panel including a novel structure that is suitable for preventing a short circuit between terminals. The present invention relates to a display panel including: an active matrix substrate; a counter substrate; and a sealing material, the active matrix substrate including a plurality of terminals outside the display region; and a plurality of insulating films respectively formed from inside to outside the display region, wherein lower portions of the plurality of terminals are formed of a same material as the gate wiring or the source wiring, upper portions of the plurality of terminals are formed of a same material as the pixel electrode, and the plurality of insulating films includes an inorganic insulating film and an organic insulating film thicker than the inorganic insulating film, the inorganic insulating film and the organic insulating film being arranged between the gate wiring or the source wiring and the pixel electrode, the organic insulating film including an end portion arranged on an outer side of a region where the sealing material is provided and at a position distant from a region where the terminals are provided, the inorganic insulating film including an end portion arranged on a boundary between the plurality of wirings and the plurality of terminals.

4 Claims, 9 Drawing Sheets

DISPLAY PANEL

TECHNICAL FIELD

The present invention relates to a display panel. More specifically, the present invention relates to a display panel suitably used for a liquid crystal display device driven by the active matrix system.

BACKGROUND ART

Known driving systems of display devices (e.g., liquid crystal display device) include the active matrix system. For example, in an active-matrix liquid crystal display device, gate wirings (also referred to as "gate bus lines") and source wirings (also referred to as "source bus lines") orthogonal to each other are arranged in lattice and respective domains defined in a matrix by the gate wirings and the source wirings include a thin film transistor. When a scanning signal is sent to a gate electrode of the thin film transistor via the gate wiring, the thin film transistor that is a switching element is turned ON. When the thin film transistor is ON, an image signal running in the source wiring is transmitted from a source electrode to a drain electrode in the thin film transistor, and further to a pixel electrode. The image signal sent to each pixel electrode corresponds to the voltage applied between the pixel electrode provided in correspondence with each pixel and a common electrode shared by all the pixels. In other words, the image signal corresponds to the voltage applied to liquid crystals of each pixel. The alignment of liquid crystals is changed in accordance with the voltage applied to the liquid crystals, so that the amount of light passing therethrough is controlled in each pixel. This enables display of high-definition images. Such active matrix system is commonly employed in TVs, monitors, and the like which perform display using a large number of pixels.

In a display device, many component members (e.g., gate wiring, source wiring, and thin film transistor) are arranged in a display region on an active matrix substrate. In an outer periphery region on the active matrix substrate, terminals electrically connected to gate wirings or source wirings are arranged. Via the terminals, display signals (scanning signal, image signal) are transmitted from an external circuit to an active matrix substrate. Many pieces of literature disclosing the structure of such a terminal are known (e.g., Patent Literature 1 to 3).

CITATION LIST

Patent Literature

Patent Literature 1: JP-A 2002-303889
Patent Literature 2: JP-A 2009-128761
Patent Literature 3: JP-A 2011-100041

SUMMARY OF INVENTION

Technical Problem

An active matrix substrate includes a large number of wirings and electrodes, and therefore commonly includes an insulating film for the purpose of ensuring insulation between wirings and electrodes. An insulating film may be provided for the purpose of planarizing irregularities of a substrate surface. For example, an interlayer insulating film formed of an organic material may be provided as a base of a pixel electrode. Such an insulating film is commonly formed on almost all surface of the substrate but may be removed in the outer periphery region of the substrate in some cases, for example, for exposing terminals connected to gate wirings or source wirings.

Materials commonly used for gate wirings or source wirings are easily corroded, and therefore are preferably not exposed in the outer periphery region of the substrate. Accordingly, the terminals may have a surface covered with a material that is used for pixel electrodes provided above the gate wirings or the source wirings.

In the case where the terminals has a surface covered with a material used for the pixel electrode, a short circuit may problematically occur if the distance between terminals is small. As described in Patent Literature 1 and 2, such a short circuit is caused by a remaining part (hereafter, also referred to as a "remaining film") of a conductive film to be removed between terminals. Such part is formed due to a level difference formed in an end portion of an interlayer insulating film upon formation of surface layers of pixel electrodes and terminals by patterning a conductive film by photolithography.

The following will describe the reason why the conductive film between terminals is not removed to remain with reference to drawings. FIG. 1 is a plan view schematically illustrating one example of a conventional active matrix substrate. The active matrix substrate in FIG. 1 is provided with an outer periphery region 60 where terminals are to be arranged, at a lower portion and a right end portion of the substrate. FIG. 2 is an enlarged plan view schematically illustrating the boundary between a display region 50 and the outer periphery region 60 at the right end portion of the substrate in FIG. 1. A gate wiring 11 shown in FIG. 2 has a left half (closer to the display region 50) covered with an insulating film 31 and a right half exposed from the insulating film 31. The parts exposed from the insulating film 31 function as terminals 21. In FIG. 2, desired display cannot be performed as a short circuit is caused by remaining films 32d of a conductive film between the terminals 21.

The process of forming the remaining film 32d of a conductive film is described based on a cross-sectional view taken along the A-B line in FIG. 2. The region along the A-B line in FIG. 2 is a region between the terminals 21 where the conductive film 32 is supposed to be removed. As shown in FIG. 2, however, the remaining films 32d of a conductive film are formed between the terminals 21.

The reason why the remaining film 32d of a conductive film is formed is related to the step of patterning the conductive film 32 by photolithography. The patterning step of the conductive film is described in the following with reference to FIGS. 3 to 5. FIG. 3 is a cross-sectional view taken along the A-B line in FIG. 2 and illustrates a state where a resist film 33 is formed on the conductive film 32 for forming a terminal. The conductive film 32 for forming a terminal in FIG. 3 is a film for forming surface layers of the pixel electrodes and the terminals 21. In FIG. 3, the resist film 33 for photolithography is formed on the conductive film 32. Due to the level difference formed in the insulating film 31 under the conductive film 32, a thickness D1 in a region adjacent to the level difference is greater than a thickness D2 in another region in the resist film 33. In photolithography, the resist film 33 in FIG. 3 is exposed and then developed.

As shown in FIG. 3, however, since the resist film 33 in the region adjacent to the level difference is thick, exposure treatment may be insufficient in that region, so that a part of the resist film is not removed after development to remain as a remaining film 33d as shown in FIG. 4. In such a case, when the resist film after development is used in patterning of the conductive film 32, as shown in FIG. 5, the remaining film 32d of the conductive film may be formed in a region along the A-B line in FIG. 2. As a result, the terminals 21 adjacent to each other across the region along the A-B line in FIG. 2 short out due to the remaining film 32d of the conductive film.

As above, in a conventional structure, a problem to be solved is that a part of the conductive film 32 that is supposed to be removed between the terminals 21 tends to remain due to the level difference formed in an end portion of the insulating film 31. A novel means for preventing a short circuit of terminals which is different from the means disclosed in Patent Literature 1 and 2 has been demanded.

The present invention is devised in consideration of the state of the art and aims to provide a display panel including a novel structure that is suitable for preventing a short circuit between the terminals.

Solution to Problem

The present inventors have intensively studied about the structure suitable for preventing a short circuit between terminals in relation to the display panels driven by the active matrix system, to focus on a thick organic insulating film among insulating films formed in the vicinity of terminals. The present inventors found that the problem can be solved by the structure wherein an end portion of an organic insulating film is arranged on an outer side of a region where a sealing material is provided and at a position distant from a region where terminals are provided, and an end portion of an inorganic insulating film is arranged on a boundary between the wirings and the terminals. Thus, the present invention was completed.

Specifically, the present invention relates to a display panel including: an active matrix substrate; a counter substrate facing the active matrix substrate; and a sealing material provided around a display region where the active matrix substrate and the counter substrate face each other, to bond the active matrix substrate and the counter substrate, the active matrix substrate including a gate wiring, a source wiring, and a pixel electrode inside the display region; a plurality of wirings arranged side by side and a plurality of terminals respectively connected to the plurality of wirings outside the display region; and a plurality of insulating films respectively formed from inside to outside the display region, wherein the plurality of wirings and lower portions of the plurality of terminals are formed of a same material as the gate wiring or the source wiring, and upper portions of the plurality of terminals are formed of a same material as the pixel electrode; and the plurality of insulating films includes an inorganic insulating film and an organic insulating film thicker than the inorganic insulating film, the inorganic insulating film and the organic insulating film being arranged between the gate wiring or the source wiring and the pixel electrode, the organic insulating film including an end portion arranged on an outer side of a region where the sealing material is provided and at a position distant from a region where the terminals are provided, the inorganic insulating film including an end portion arranged on a boundary between the plurality of wirings and the plurality of terminals.

The plurality of wirings and lower portions of the plurality of terminals are formed of the same material as the gate wiring or the source wiring. Therefore, the plurality of wirings and lower portions of the plurality of terminals can be formed in the same process as the gate wiring or the source wiring, for example, by photolithography. The plurality of wirings and lower portions of the plurality of terminals may or may not be integrally formed with the gate wiring or the source wiring. For example, the plurality of wirings each may be connected to the gate wiring or the source wiring through another wiring.

The upper portions of the plurality of terminals are formed of the same material as the pixel electrode. Therefore, the upper portions of the plurality of terminals can be formed in the same process as the pixel electrode, for example, by photolithography. The material of the gate wiring or the source wiring easily corrodes, and therefore, covering with a pixel electrode material that is less likely to corrode more surely maintains electric connection between the terminals and an external circuit.

The plurality of insulating films includes an inorganic insulating film and an organic insulating film thicker than the inorganic insulating film. The inorganic insulating film is formed by sputtering, Chemical Vapor Deposition (CVD), or the like. The organic insulating film can be formed by coating (e.g. spin coating) and is formed thicker than the inorganic insulating film. Therefore, the organic insulating film is suitably used for planarization of an insulating film surface and reduction of the parasitic capacitance between a wiring or an electrode positioned in a layer above the insulating film and a wiring or an electrode positioned in a layer below the insulating film. As mentioned above, the thickness of the insulating film is preferably smaller in the vicinity of the terminals, and therefore, an end portion of the organic insulating film is preferably arranged on the inner side (center side of the substrate) of the region where the terminals are provided. In the case where the organic insulating film positioned on the inner side of the region where the sealing material is provided, a region as a margin needs to be ensured in consideration of a positional relationship with a lower layer and bonding with a color filter of a counter substrate. Accordingly, for preventing lowering of the aperture ratio, the end portion of the organic insulating film is preferably arranged on the outer side of the region where the sealing material is provided. Consequently, the end portion of the organic insulating film is arranged on the outer side of the region where the sealing material is provided and at a position distant from the region where the terminals are provided.

An end portion of the inorganic insulating film is arranged on a boundary between the plurality of wirings and the plurality of terminals. In other words, the plurality of wirings is covered with the inorganic insulating film and the plurality of terminals is not covered with the inorganic insulating film. Corrosion of the terminals is prevented by providing a layer formed of the same material as the pixel electrode on lower portions of the terminals. In the case where a plurality of inorganic insulating films is provided between the gate wiring or the source wiring and the pixel electrode, at least one of end portions of the inorganic insulating films may be arranged on the boundary between the plurality of wirings and the plurality of terminals. All of end portions of the inorganic insulating films may be arranged on the boundary between the plurality of wirings and the plurality of terminals.

The inorganic insulating film and the organic insulating film are arranged between the gate wiring or the source wiring and the pixel electrode. Examples of the inorganic insulating film include a gate insulating film provided between a gate wiring and a semiconductor layer, and one of insulating films forming an interlayer insulating film arranged between a source wiring and a pixel electrode. Examples of the organic insulating film include one of insulating films forming an interlayer insulating film.

The display panel of the present invention can be used for a liquid crystal panel, for example. A liquid crystal display device including such a liquid crystal panel is another embodiment of the present invention.

Advantageous Effects of Invention

The present invention provides a display panel including a novel structure which is suitable for preventing a short circuit between terminals.

DESCRIPTION OF EMBODIMENTS

The present invention is more specifically described based on, but not limited to, the following embodiments with reference to drawings.

Embodiment 1

Figure 1:
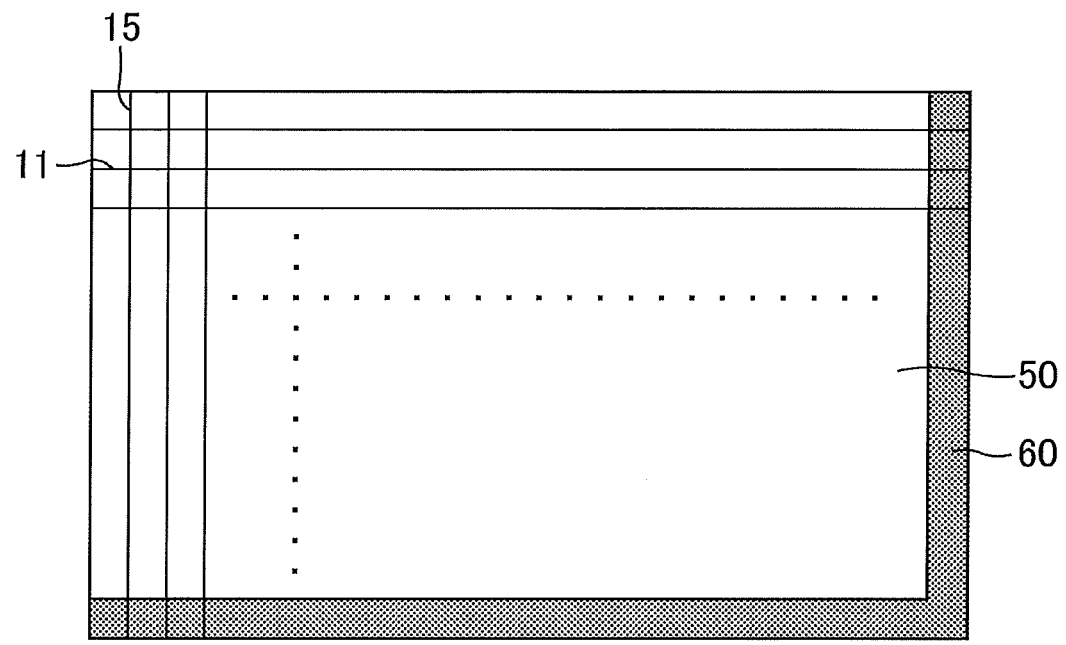
FIG. 1 is a plan view schematically illustrating one example of a conventional active matrix substrate.
Figure 2:
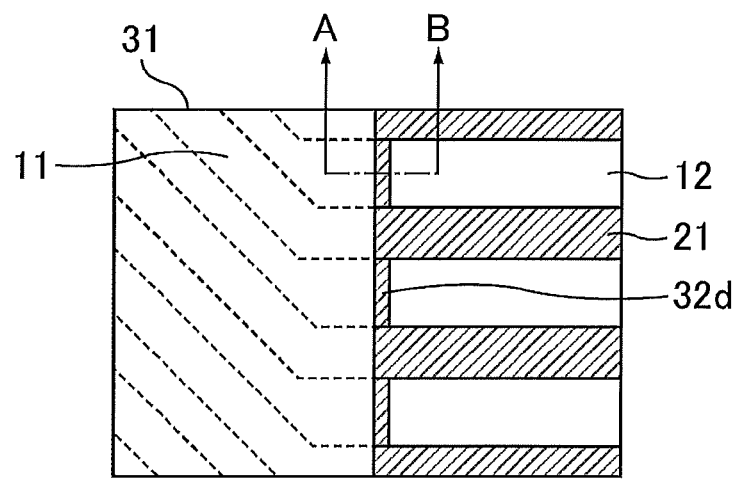
FIG. 2 is an enlarged plan view schematically illustrating a boundary between a display region 50 and an outer periphery region 60 in the right end portion of the substrate in FIG. 1.
Figure 3:
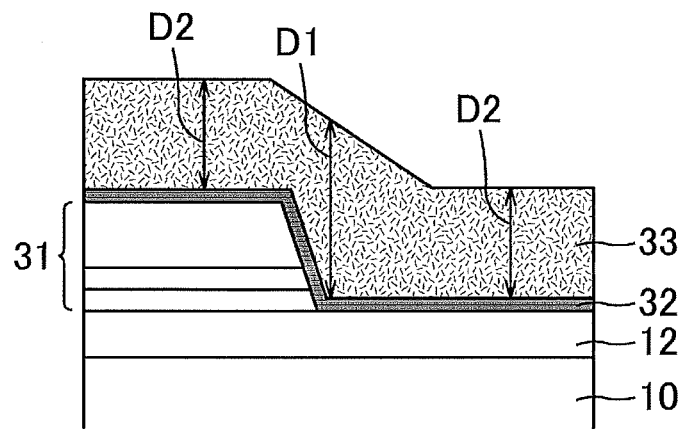
FIG. 3 is a cross-sectional view taken along the A-B line in FIG. 2 and illustrates a state where a resist film is formed on a conductive film for forming a terminal.
Figure 4:
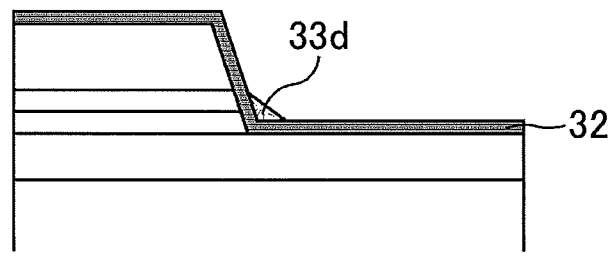
FIG. 4 is a cross-sectional view taken along the A-B line in FIG. 2 and illustrates a state where the resist film in FIG. 3 is etched after exposure.
Figure 5:
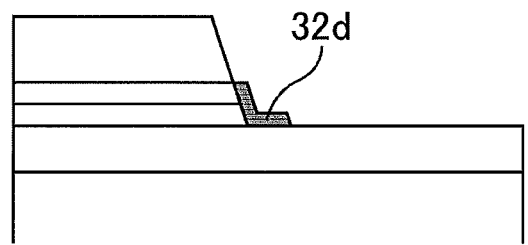
FIG. 5 is a cross-sectional view taken along the A-B line in FIG. 2 and illustrates a state where a conductive film is etched using the resist film in FIG. 4.
Figure 6:
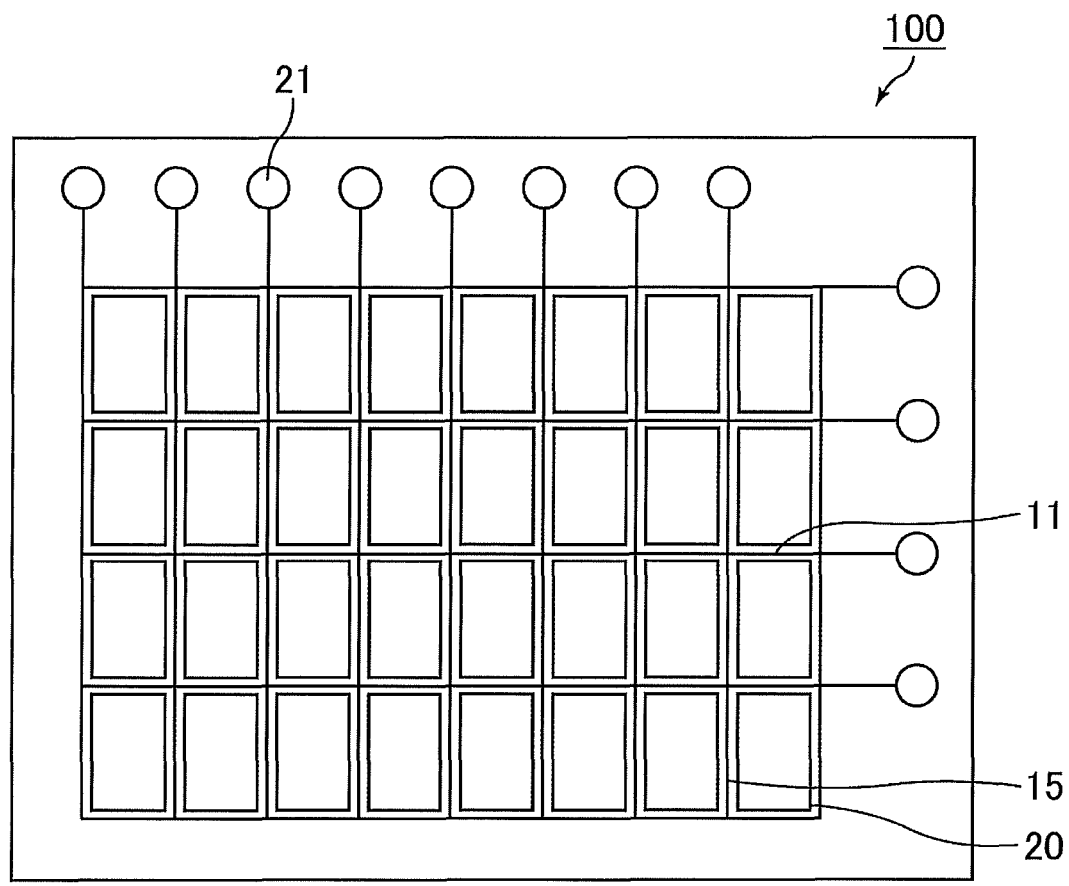
FIG. 6 is a plan view schematically illustrating an active matrix substrate of Embodiment 1.

FIG. 6 is a plan view schematically illustrating an active matrix substrate of Embodiment 1. As shown in FIG. 6, an active matrix substrate 100 of the present embodiment includes a display region where a plurality of pixels are arranged in a matrix, and an outer periphery region where a plurality of terminals 21 are arranged around the display region. In the display region, a pixel electrode 20 is arranged in each pixel. A display signal to be sent to each pixel electrode 20 is controlled by a thin film transistor. To a gate electrode of the thin film transistor, a gate wiring 11 for transmitting a scanning signal is connected. To a source electrode of the thin film transistor, a source wiring 15 for transmitting an image signal to the pixel electrode 20 is connected. The gate wiring 11 and the source wiring 15 extend into the outer periphery region and are connected to the terminals 21.

The active matrix substrate 100 is bonded to a counter substrate by a sealing material 40 to form a display panel of the present embodiment. In the display panel, the sealing material 40 is arranged around the display region. The sealing material 40 before curing may be arranged on the active matrix substrate 100 or the counter substrate.

Figure 7:
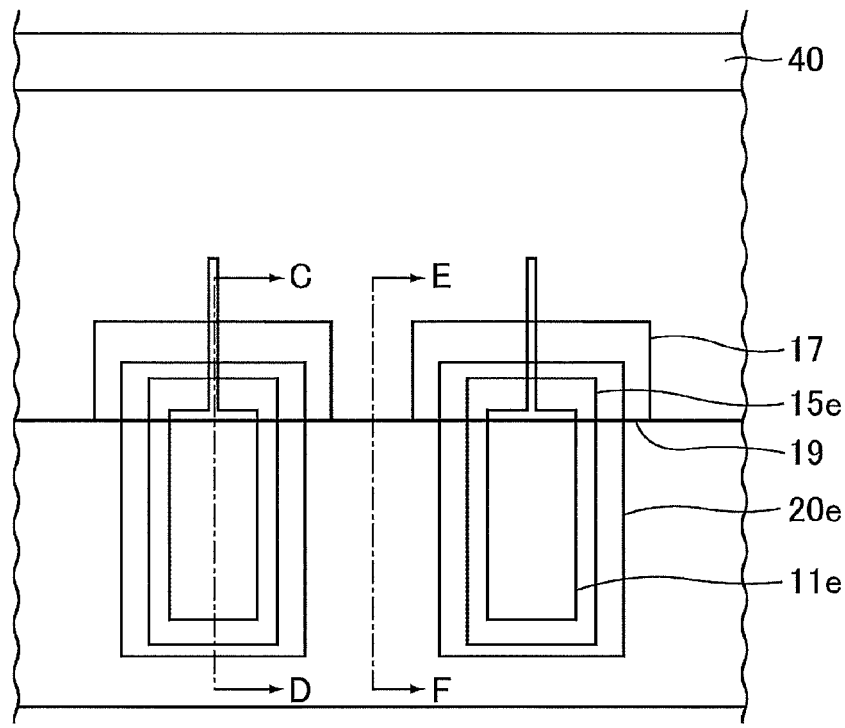
FIG. 7 is a plan view schematically illustrating the vicinity of the terminals in the active matrix substrate of Embodiment 1.
Figure 8:
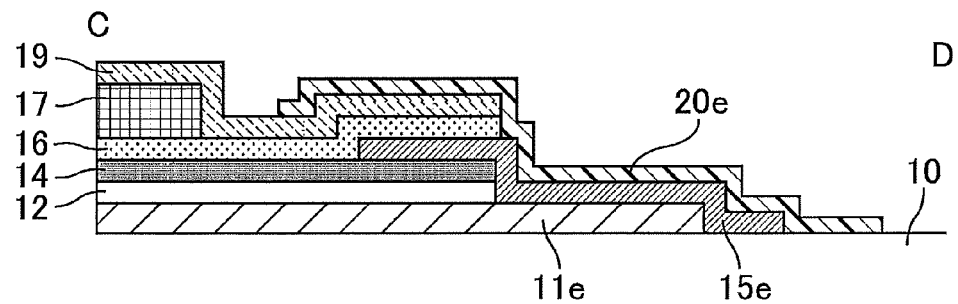
FIG. 8 is a cross-sectional view taken along the C-D line in FIG. 7.
Figure 9:
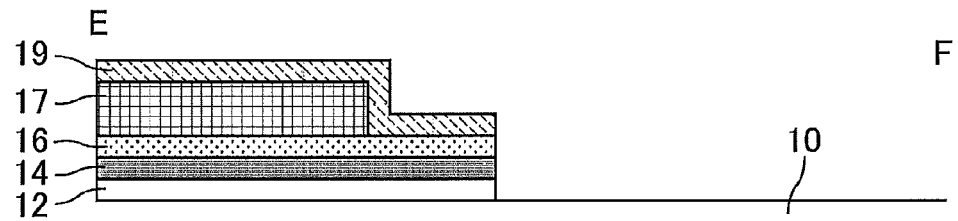
FIG. 9 is a cross-sectional view taken along the E-F line in FIG. 7.

FIG. 7 is a plan view schematically illustrating the vicinity of the terminals in the active matrix substrate of Embodiment 1. FIG. 8 is a cross-sectional view taken along the C-D line in FIG. 7. FIG. 9 is a cross-sectional view taken along the E-F line in FIG. 7. As shown in FIG. 9, in the present embodiment, a transparent conductive film 20e forming an uppermost layer of the terminal 21 shown in FIG. 8 is not present between the terminals 21 adjacent to each other, so that the terminals 21 adjacent to each other are electrically isolated.

As shown in FIG. 6, a plurality of terminals 21 respectively connected to a plurality of gate wirings 11 running in parallel with one another is arranged on the right end of the active matrix substrate 100 of Embodiment 1, and a plurality of terminals 21 respectively connected to a plurality of source wirings 15 running in parallel with one another is arranged on the upper end of the substrate. FIGS. 7 and 8 each illustrate the terminals 21 connected to the gate wirings 11.

As shown in FIGS. 7 and 8, the terminal 21 in the active matrix substrate 100 of the present embodiment is formed by stacking a gate metal 11e, a source metal 15e, and the transparent conductive film 20e. The gate metal 11e refers to a component member formed in the same process as the gate wiring 11 or a material thereof. The source metal 15e refers to a component member formed in the same process as the source wiring 15 or a material thereof. Each component member forming the gate metal 11e is, for example, a part separated by patterning of a single conductive film or a part identified from a functional view point. The same shall apply to each component member forming the source metal 15e. Each component member forming the gate metal 11e is formed of the same material as the gate wiring 11. Each component member forming the source metal 15e is formed of the same material as the source wiring 15. Examples of the gate metal 11e include, in addition to the lowermost layer of the terminal 21, a gate electrode of the thin film transistor and the gate wiring 11. Examples of the source metal 15e include, in addition to the center layer of the terminal, the source electrode and the drain electrode of the thin film transistor, and the source wiring 15. The transparent conductive film 20e forming the terminal 21 is formed in the same process as the pixel electrode 20 and formed of the same material as the pixel electrode 20. As above, the terminal 21 is formed utilizing the process of forming component members in the display region.

The source metal 15e (the center layer of the terminal 21) and the transparent conductive film 20e (the uppermost layer of the terminal 21) are insularly formed. The gate metal 11e (the lowermost layer of the terminal 21) is drawn out from the gate wiring 11 in the display region and is also spreading under a first insulating film 12. The gate metal 11e and the source metal 15e are each formed of a material that easily corrodes. In contrast, the transparent conductive film 20e is formed of a material that is less likely to corrode. Arrangement of the transparent conductive film 20e (the uppermost layer of the terminal 21) prevents corrosion of the terminal 21. As a result, electrical connection between the terminal 21 and an external circuit is more surely maintained.

The terminal 21 connected to the source wiring 15 includes a structure in which the gate metal 11e (the lowermost layer of the terminal 21) and the transparent conductive film 21e (the uppermost layer of the terminal 21) are insularly formed and the source metal 15e (the center layer of the terminal 21) is drawn out from the source wiring 15 in the display region.

Examples of the material of the gate metal 11e include metals mainly containing an element such as Ta, Ti, W, Mo, and Al. Specifically, suitably used are a multilayer film (W/TaN) of a tungsten film and a tantalum nitride film, a molybdenum film (Mo), a molybdenum/tungsten alloy film (MoW), and a multilayer film (Ti/Al) of a titanium film and an aluminum film.

Examples of the material of the source metal 15e include metals mainly containing an element such as Ta, Ti, W, Mo, and Al. Specifically, suitably used are a multilayer film (Ti/Al/Ti) of a titanium film, an aluminum film, and a titanium film, a multilayer film (Ti/Al) of a titanium film and an aluminum film, a multilayer film (TiN/Al/TiN) of a titanium nitride film, an aluminum film, and a titanium nitride film, a multilayer film (Mo/Al—Nd/Mo) of a molybdenum film, an aluminum-neodymium film, and a molybdenum film, a multilayer film (Mo/Al/Mo) of a molybdenum film, an aluminum film, and a molybdenum film. These films may be formed by sputtering, vacuum deposition, or the like.

Examples of the material of the transparent conductive film 20e include indium tin oxide (ITO) and indium zinc oxide (IZO).

Figure 10:
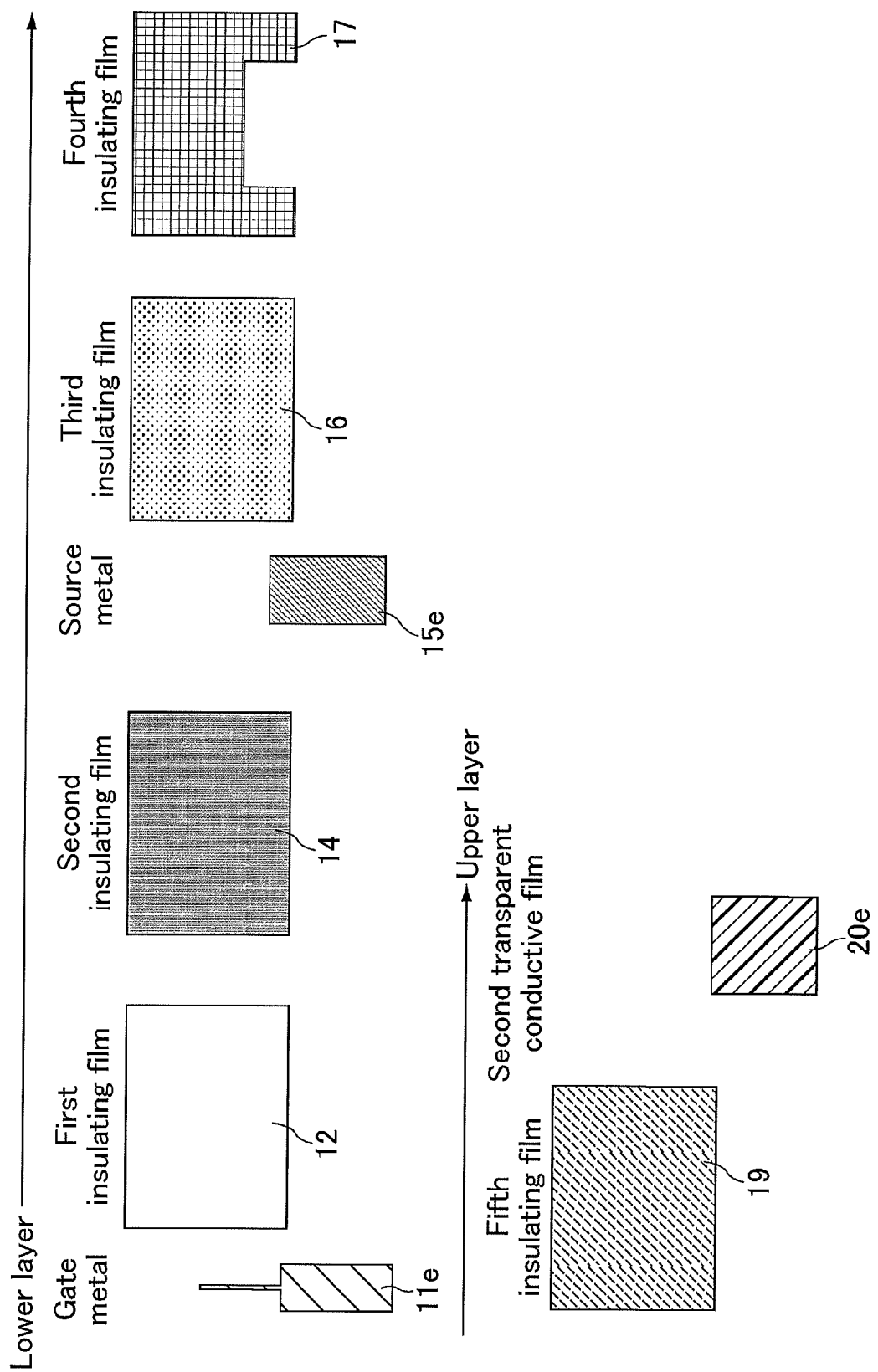
FIG. 10 is a plan view schematically illustrating disassembled component members each forming the vicinity of the terminal of Embodiment 1.
Figure 11:
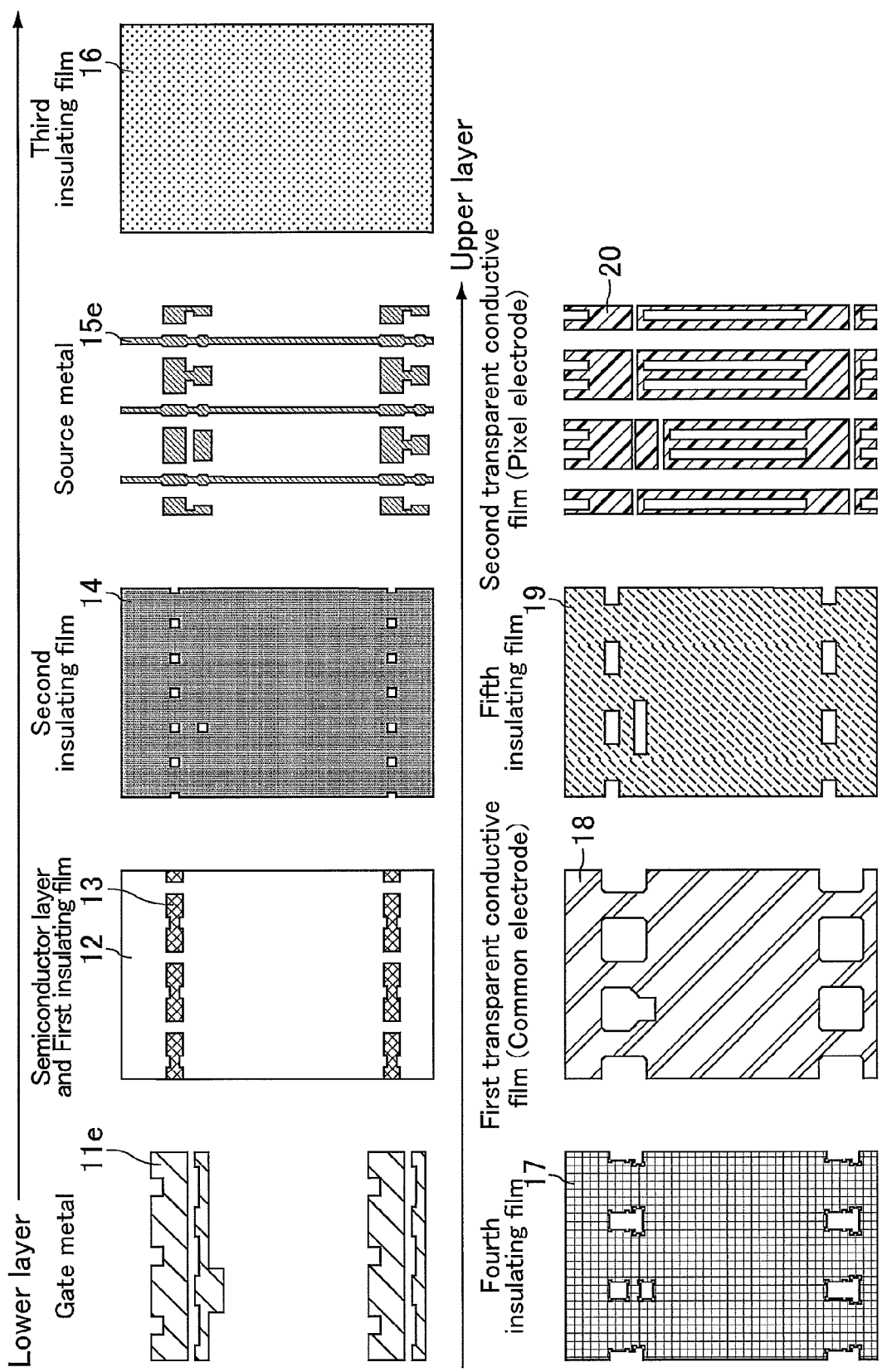
FIG. 11 is a plan view schematically illustrating disassembled component members each forming a pixel of Embodiment 1.

As shown in FIGS. 8 and 9, the active matrix substrate 100 of Embodiment 1 is formed by stacking a plurality of conductive members and insulating members. FIG. 10 is a plan view schematically illustrating disassembled component members each forming the vicinity of the terminal 21 of Embodiment 1. FIG. 11 is a plan view schematically illustrating disassembled component members each forming a pixel of Embodiment 1. In each pixel as shown in FIG. 11, a gate metal 11e, a first insulating film (gate insulating film) 12, a semiconductor layer 13, a second insulating film 14, a source metal 15e, a third insulating film 16, a fourth insulating film 17, a first transparent conductive film (common electrode) 18, a fifth insulating film 19, and a second transparent conductive film (pixel electrode) 20 are stacked on an insulating substrate 10. In the vicinity of the terminal 21 as shown in FIG. 10, the gate metal 11e, the first insulating film (gate insulating film) 12, the second insulating film 14, the source metal 15e, the third insulating film 16, the fourth insulating film 17, the fifth insulating film 19, and the second transparent conductive film (pixel electrode) 20e are stacked on the insulating substrate 10, and the semiconductor layer 13 and the first transparent conductive film (common electrode) 18 are not formed.

All of the first to fifth insulating films 12, 14, 16, 17, and 19 is formed from inside to outside the display region, spreading over a region where the sealing material 40 is arranged outside the display region. The first to third and fifth insulating films 12, 14, 16, and 19 are formed to the boundary between the gate wirings 11 or the source wirings 15 and the terminals 21. In contrast, the fourth insulating film 17 is ended at a position distant from a region where the terminals 21 are arranged. The reason for this is that the fourth insulating film 17 in the vicinity of the terminal 21 is removed to reduce the level difference in the vicinity of the terminals 21 as the first, second, third, and fifth insulating films 12, 14, 16, and 19 each are an inorganic insulating film formed of an inorganic material, and the fourth insulating film 17 is an organic insulating film formed of an organic material which is thicker than the inorganic insulating film. As mentioned above, a large level difference in the vicinity of the terminals 21 may cause a short circuit between the terminals 21 because the second transparent conductive film 20e used for the uppermost layer of the terminal 21 is likely to remain between the terminals 21. In the present embodiment, however, since the organic insulating film is not present in the vicinity of the terminals 21, a resist film is prevented from remaining between the terminals 21 after formation of a transparent conductive film formed of the material of the pixel electrode 20, formation of the resist film formed of a photosensitive resin, exposure of the resist film, and etching (development) of the resist film. Accordingly, the transparent conductive film 20e does not remain between the terminals 21 when the transparent conductive film is etched subsequent to the etching of the resist film.

Examples of the material of the inorganic insulating film include silicon oxide ($SiO_2$), silicon nitride ($SiN_x$), and silicon nitride oxide (SiNO). Examples of the material of the organic insulating film include acrylic resins. Preferred are photosensitive acrylic resins.

Examples of the material of the semiconductor layer 13 include amorphous silicon, monocrystalline silicon, polycrystalline silicon, continuous grain silicon, and oxide semiconductors. Examples of the oxide semiconductors include indium/gallium/zinc complex oxide (IGZO), ISZO (In—Si—Zn—O), IAZO (In—Al—Zn—O), INiZO (In—Ni—Zn—O), ICuZO (In—Cu—Zn—O), IHfZO (In—Hf—Zn—O), and IZO (In—Zn—O).

The display panel of the present embodiment is a liquid crystal panel incorporated in a liquid crystal display device. A liquid crystal material is enclosed between the active matrix substrate 100 and the counter substrate which are bonded by the sealing material 40.

As shown in FIG. 11, in the case of the active matrix substrate 100 of the present embodiment, the pixel electrode 20 and the common electrode 18 are provided on the same substrate. In this case, the alignment of liquid crystal molecules is controlled in a plane in parallel with the substrate face in accordance with the voltage applied between the pixel electrode 20 and the common electrode 18. Between the pixel electrode 20 and the common electrode 18, the fifth insulating film 19 is provided. The liquid crystal panel including such a structure is a liquid crystal panel of the fringe field switching (FFS) mode that is a kind of the transverse electric field mode.

Figure 12:
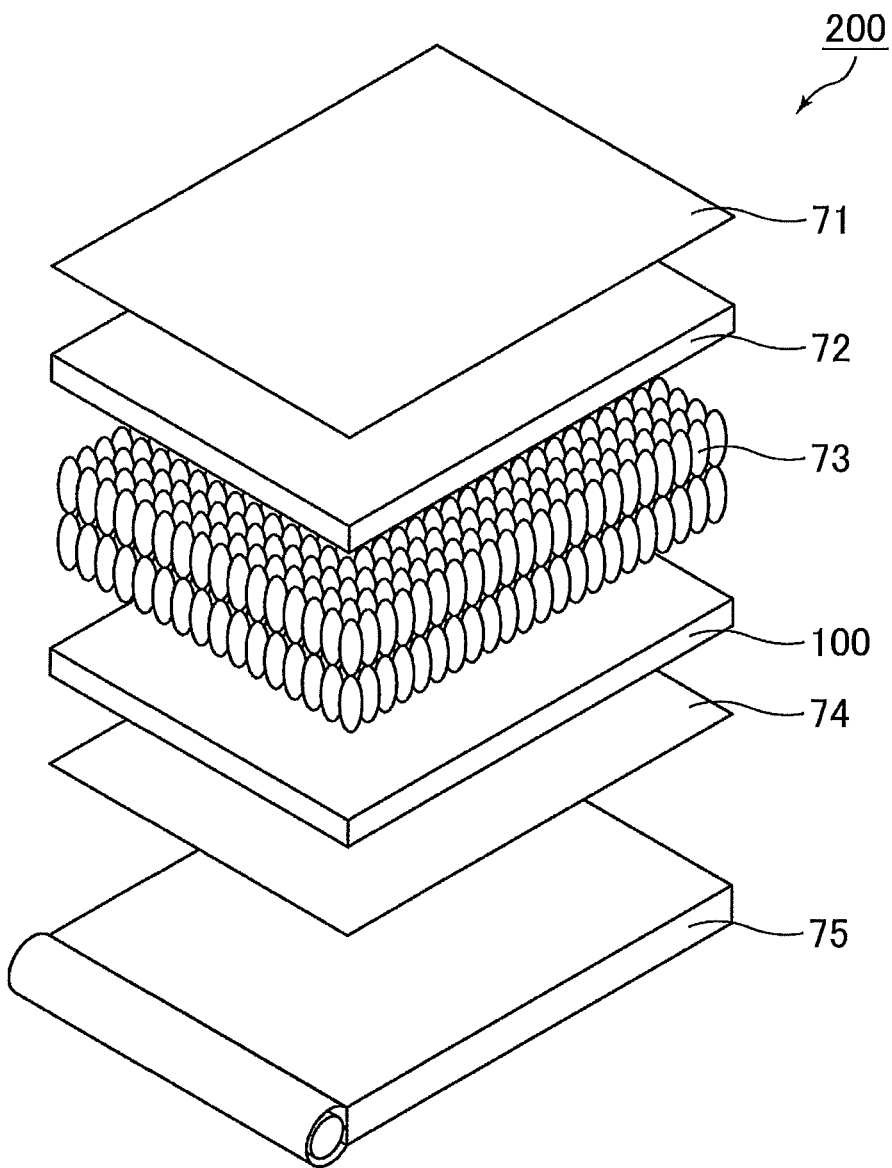
FIG. 12 is an exploded perspective view schematically illustrating the structure of a liquid crystal panel and a back light unit of Embodiment 1.

FIG. 12 is an exploded perspective view schematically illustrating the structure of a liquid crystal panel and a back light unit of Embodiment 1. As shown in FIG. 12, a liquid crystal layer 73 is interposed between the active matrix substrate 100 and a counter substrate 72. The active matrix substrate 100 and the counter substrate 72 are interposed between a pair of polarizing plates 71 and 74. On the back face of a liquid crystal panel 200, a back light unit 75 is provided. Moreover, if needed, various optical films are provided between the back light unit 75 and the liquid crystal panel 200, and various optical films and a touch panel are provided on the front side (display screen side) of the liquid crystal panel 200, for example.

Light emitted from the back light unit 75 passes through the polarizing plate 74, the active matrix substrate 100, the liquid crystal layer 73, the counter substrate 72, and the polarizing plate 71 to reach the display screen. Control of the alignment of liquid crystal molecules in the liquid crystal layer 73 enables to control the amount of light passing through the liquid crystal panel 200.

Though the present embodiment relates to a transmission-type liquid crystal display device, the display panel of the present invention may be used for any of the liquid crystal display devices of the transmission type, reflection type, and transflective type (transmission/reflection type). In a transmission-type liquid crystal display device, a back light unit is provided on the back side of the liquid crystal panel and polarizing plates are provided respectively on the display side surface and the back side surface of the liquid crystal panel. In contrast, in a reflection-type liquid crystal display device, a reflection film is provided behind the liquid crystal layer of the liquid crystal panel, and a circularly polarizing plate is provided on the display side surface of the liquid crystal panel. The reflection film may be a pixel electrode (reflective electrode) provided with a reflective plane on the liquid crystal layer side, or a component member different from the pixel electrode in the case where the pixel electrode is a transmission electrode. A reflection-type liquid crystal display device may use external light as display light or include a front light on a display screen side of the liquid crystal layer. In a transflective liquid crystal display device, a transmission region performing transmission display and a reflection region performing reflection display are provided in a pixel, or a transflective film is provided in a pixel. The transmission region is provided with a transmission electrode. The reflection region is provided with a reflection electrode or a laminate of a transmission electrode and a reflection film. Since a transflective liquid crystal display device performs transmission display, a back light unit is provided on the back side of a liquid crystal panel and polarizing plates are respectively provided on the display side surface and the back side surface of the liquid crystal panel, in the same manner as in the transmission-type liquid crystal display device. Moreover, for performing reflection display, at least the polarizing plate on the display side is provided with a λ/4 retardation plate so that a circularly polarizing plate is formed.

The present embodiment relates to a liquid crystal panel of the FFS mode. The display panel of the present invention may be used for display panels of various display modes such as the In-Plane-Switching (IPS) mode, vertical alignment (VA) mode, twisted nematic (TN) mode, and OCB mode. The FFS mode is a kind of the horizontal alignment mode and is included in the IPS mode in a broad sense.

Figure 13:
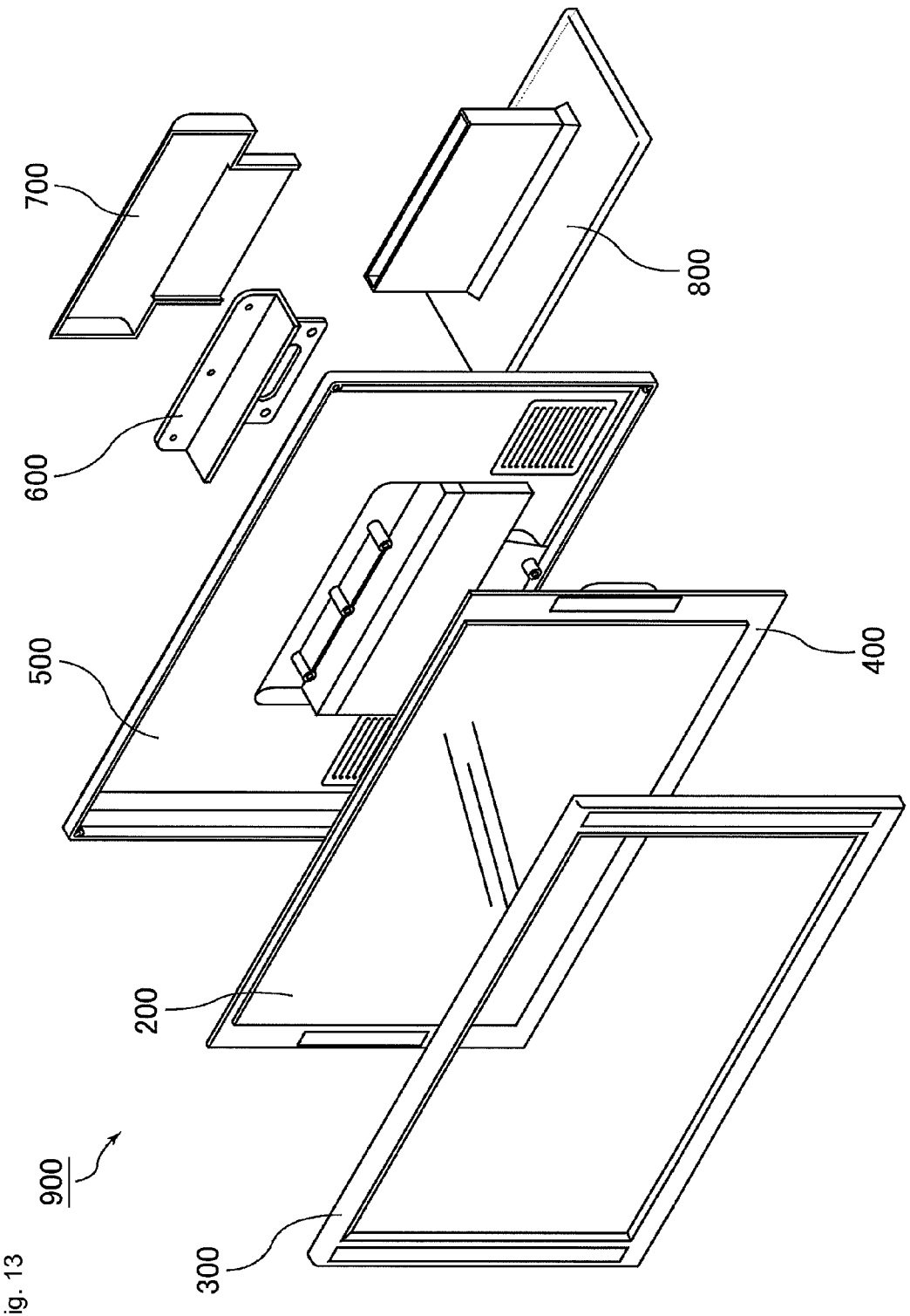
FIG. 13 is an exploded perspective view schematically illustrating the structure of a liquid crystal display device including the liquid crystal panel shown in FIG. 12.

FIG. 13 is an exploded perspective view schematically illustrating the structure of a liquid crystal display device including the liquid crystal panel shown in FIG. 12. As shown in FIG. 13, the liquid crystal panel 200 is immobilized on a fixation panel 400 and enclosed by a front cabinet 300 and a back cabinet 500. Then, the back cabinet 500 and an upper stand 700 are fixed with a metal fitting 600. Further, the upper stand 700 is engaged with a lower stand 800. To a terminal of the liquid crystal panel 200, an external circuit for driving is connected Embodiments 2 and 3

Figure 14:
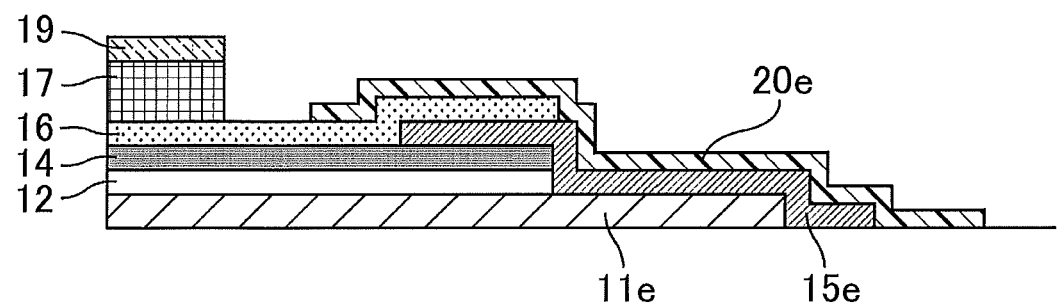
FIG. 14 is a cross-sectional view schematically illustrating the vicinity of a terminal of an active matrix substrate of Embodiment 2.
Figure 15:
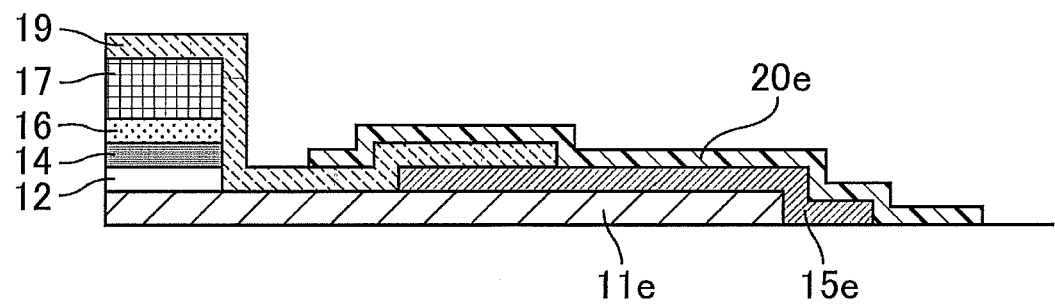
FIG. 15 is a cross-sectional view schematically illustrating the vicinity of a terminal of an active matrix substrate of Embodiment 3.

In Embodiment 1, all the inorganic insulating films (the first to third and fifth insulating films) 12, 14, 16, 17, and 19 formed between the gate metal 11e and the second transparent conductive film 20e are formed to the boundary between the gate wirings 11 or the source wirings 15 and the terminals 21. However, any of the first to third and fifth insulating films 12, 14, 16, and 19 may be formed to the boundary between the gate wirings 11 or the source wirings 15 and the terminals 21. Exemplary arrangements of the inorganic insulating film include a pattern shown in FIG. 14 (Embodiment 2) and a pattern shown in FIG. 15 (Embodiment 3). In Embodiment 2, the inorganic insulating films (the first to third insulating films) 12, 14, and 16 in a layer below the organic insulating film (fourth insulating film) 17 are formed to the boundary between the gate wirings 11 or the source wirings 15 and the terminals 21, and the inorganic insulating film (fifth insulating film) 19 in a layer above the organic insulating film (fourth insulating film) 17 is not formed to the boundary between the gate wirings 11 or the source wirings 15 and the terminals 21. In Embodiment 3, the inorganic insulating films (the first to third insulating films) 12, 14, and 16 in a layer below the organic insulating film (fourth insulating film) 17 are not formed to the boundary between the gate wiring 11 or the source wirings 15 and the terminals 21, and the inorganic insulating film (fifth insulating film) 19 in a layer above the organic insulating film (fourth insulating film) 17 is formed to the boundary between the gate wirings 11 or the source wirings 15 and the terminals 21, covering the organic insulating film 17.

The aforementioned embodiments may be modified as long as the modification is not beyond the technical idea of the present invention. For example, a part of the structure described in a specific embodiment may be replaced by a part of the structure of another embodiment, or the embodiments may be employed in an appropriate combination. The above embodiments each relate to a liquid crystal display device. The display panel of the present invention can also be used for an EL display device, for example. The EL display device may be an organic EL display device or an inorganic EL display device.

REFERENCE SIGNS LIST

10 Insulating substrate
11 Gate wiring
11e Gate metal
12 First insulating film (gate insulating film)
13 Semiconductor layer
14 Second insulating film
15 Source wiring
15e Source metal
16 Third insulating film
17 Fourth insulating film
18 Common electrode
19 Fifth insulating film
20 Pixel electrode
20e Transparent conductive film
21 Terminal
31 Insulating film
32 Conductive film
32d Remaining film of conductive film
33 Resist film
33d Remaining film of resist film
40 Sealing material
50 Display region
60 Outer periphery region
71 Polarizing plate
72 Counter substrate
73 Liquid crystal layer
74 Polarizing plate
75 Back light unit
100 Active matrix substrate
200 Liquid crystal panel
300 Front cabinet
400 Fixation panel 500 Back cabinet
600 Metal fitting
700 Upper stand
800 Lower stand
900 Liquid crystal display device

The invention claimed is:

1. A display panel comprising:
an active matrix substrate;
a counter substrate facing the active matrix substrate;
a sealing material provided around a display region where the active matrix substrate and the counter substrate face each other, to bond the active matrix substrate and the counter substrate, the active matrix substrate including a gate wiring, a source wiring, and a pixel electrode inside the display region;
a plurality of wirings arranged side by side and a plurality of terminals respectively connected to the plurality of wirings outside the display region; and
a plurality of insulating films respectively formed from inside to outside the display region, wherein
the plurality of wirings and lower portions of the plurality of terminals are formed of a same material as the gate wiring or the source wiring, and upper portions of the plurality of terminals are formed of a same material as the pixel electrode;
the plurality of insulating films includes an inorganic insulating film and an organic insulating film thicker than the inorganic insulating film, one of the plurality of insulating films being positioned between the gate wiring or the source wiring and the pixel electrode;
the organic insulating film includes an end portion arranged on an outer side of a region where the sealing material is provided and between the region where the sealing material is provided and a region where the terminals are provided;
the inorganic insulating film includes an end portion positioned on a boundary between the plurality of wirings and the plurality of terminals; and
the end portion of the organic insulating film is located away from the end portion of the inorganic insulating film.

2. The display panel according to claim 1,
wherein the active matrix substrate includes a semiconductor layer inside the display region, and
the semiconductor layer consists of an oxide semiconductor.

3. The display panel according to claim 2,
wherein the oxide semiconductor is indium/gallium/zinc complex oxide.

4. The display panel according to claim 1,
wherein the organic insulating film does not directly contact any of the plurality of terminals.

* * * * *